United States Patent
Niira et al.

(12)

(10) Patent No.: US 7,317,237 B2
(45) Date of Patent: Jan. 8, 2008

(54) PHOTOVOLTAIC CONVERSION DEVICE AND METHOD OF MANUFACTURING THE DEVICE

(75) Inventors: Koichiro Niira, Higashiomi (JP); Shigeru Gotoh, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 255 days.

(21) Appl. No.: 11/021,489

(22) Filed: Dec. 22, 2004

(65) Prior Publication Data

US 2005/0160970 A1    Jul. 28, 2005

(30) Foreign Application Priority Data

Dec. 25, 2003   (JP)  ............................. 2003-431594

(51) Int. Cl.
*H01L 31/06*     (2006.01)
(52) U.S. Cl. .................. 257/461; 257/437; 257/444; 257/451; 257/E27.123
(58) Field of Classification Search ............... 257/437, 257/444, 451, 461
See application file for complete search history.

(56) References Cited

U.S. PATENT DOCUMENTS 4,135,950 A * 1/1979 Rittner ........................ 136/255
4,490,573 A * 12/1984 Gibbons ...................... 136/255

OTHER PUBLICATIONS

Zoth, et al., "A Fast, Preparation-Free Method To Detect Iron In Silicon", J. Appl. Phys. 67 (11), Jun. 1990, pp. 6764-6771.

* cited by examiner

*Primary Examiner*—Wai-Sing Louie
(74) *Attorney, Agent, or Firm*—Hogan & Hartson LLP (57) ABSTRACT

There is disclosed a photovoltaic conversion device constructed using a p-type crystalline silicon substrate 404 doped with boron, which comprises a bulk substrate region 404, regions other than the bulk substrate region including an n-type region 403a joining to a light receiving surface of the bulk surface region, a BSF region 405 joining to a back surface of the bulk surface region, wherein with regions other than the bulk substrate region 404 being removed, when a minority carrier diffusion length of the bulk substrate region 404 is measured from the light receiving surface of the bulk surface region, $0.5 < (L1/Lpeak)$ is satisfied, where L1 is a minority carrier diffusion length at an arbitrary measuring area of the light receiving surface of the bulk surface region, and Lpeak is a diffusion length corresponding to a maximum peak on the side of higher diffusion length of a histogram, the histogram being formed from data obtained when a minority carrier diffusion length of the light receiving surface of the bulk surface region is measured at a plurality of measurement areas. This structure can reduce influence of impurities such as Fe, and enhances utilization efficiency of silicon ingots. With this structure, a photovoltaic conversion device with high photovoltaic conversion efficiency can be realized.

2 Claims, 5 Drawing Sheets

PHOTOVOLTAIC CONVERSION DEVICE AND METHOD OF MANUFACTURING THE DEVICE

BACKGROUND OF THE INVENTION

1. Field of the Invention

The present invention relates to photovoltaic conversion devices represented by solar cells, and in particular, to a photovoltaic conversion device in which the properties thereof is improved by reducing influence of impurities mixing into during the manufacture thereof.

2. Description of the Related Art

In the specification, "aEn" represents "a×10$^n$".

Bulk photovoltaic conversion devices using multicrystalline silicon substrates now occupy a major part of the market of solar cells.

Generally, multicrystalline silicon substrates are manufactured by a casting method. However, a number of metal elements are included as impurities in the multicrystalline silicon substrates that are sliced out of a multicrystalline silicon ingot produced by the casting method.

Metals, in particular, transition metals are typical factors that degrade the properties of solar cells. Therefore, reducing the influence thereof is indispensable for improving the efficiency of solar cells.

Some typical transition metal impurities included in silicon substrates after casting and before they are processed into solar cells are Fe, Cr, Ni, and the like.

Although values of concentration of these impurities vary depending on the positions thereof inside the substrate because of the reason described later, they are about 1E11-1E13/cm$^3$ when the total impurity concentration is measured by atomic absorption spectrometry, the ICP-MASS method, activation analysis, or the like. Meanwhile, the concentration thereof could be 1E14/cm$^3$ or so in the extremely low quality peripheral regions of the substrate described later, which is not rare.

These values correspond to electrical qualities of about 33-0.33 sec in minority carrier life time $\tau$, and about 320-32 µm in minority carrier diffusion length L, if 3E-14 cm$^2$ is assumed as the capture cross section. Also, the values correspond to photovoltaic conversion efficiencies of about 12-16% under the conditions of the current structure and manufacture process of solar cells of our corporate.

In other words, in cases where minority carrier life time $\tau$ and minority carrier diffusion length L are distributed inside the substrate within the foregoing ranges, photovoltaic conversion efficiencies of 12-16% can be obtained.

By the way, when classified broadly, there are two types of metal "mixing sources" in the casting method.

One of the "mixing sources" (hereinafter referred to as "mixing source 1") represents metal impurities included in the silicon starting material itself or components used during the casting such as the mold, mold release agent, crucible, heater, and the like. These are captured in the silicon crystal ingot according to the segregation coefficients of the respective elements during solidification of the molten silicon in the casting process. Since segregation coefficients of transition metals are about 1E-5, about one out of a hundred thousand of transition impurities captured in the molten liquid are captured in the crystalline silicon.

Since metal elements belonging to the "mixing source 1" are captured in the crystalline silicon due to a segregation phenomenon, they are distributed with an almost uniform concentration along a solid-liquid interface at the time of solidification, and distributed along the solidification direction so that they have higher concentration in the later solidification period, that is, as the solidification degree increases. For this reason, if an ingot obtained after casting is sliced in the direction perpendicular to the solidification direction into substrates, impurities belonging to the "mixing source 1" are distributed almost uniformly over the entire substrate area as compared to the impurity concentration distribution brought about by the "mixing source 2" described later.

The other one of the "mixing sources", which are referred to as the "mixing source 2", are impurities that are thermally diffused toward the interior of the ingot from the mold (mold release agent or the like) in contact with the ingot during a high temperature period between the solidification and cooling to room temperature of the ingot.

The doses of impurity diffusion of the "mixing source 2" are determined depending on the impurity concentration in the component in contact with the ingot, the range of temperatures, and period of time during which they are exposed to a high temperature range in which thermal diffusion is effectively caused (hereinafter referred to as "exposure temperatures" and exposure time, respectively). For example, normally, Fe concentration in a mold release agent in contact with an ingot is about 10 ppm or so. However, when the exposure temperatures are 400-1000° C. and exposure time is about 7 hr, Fe is diffused from the mold/ingot contact interface to the interior of the ingot to a depth of 10-20 mm with a high concentration of about 1E13-1E15/cm$^3$.

That is, crystalline silicon grains in bottom and side portions of an ingot with which they are in contact have extremely low quality. For this reason, the quality of substrates is particularly deteriorated in regions originating from a bottom region of the ingot, and in end portions thereof corresponding to a side portion of the ingot.

It is known that, among the transition metals, in particular, interstitial Fe included in p-type crystalline silicon doped with boron (B) can be estimated based on the amount of diffusion length L decreased after heat treatment. (Document [1]: G. Zoth et al, J. Appl. Phys. 67(1990) p6764). Similarly, it is known that it can be estimated by light irradiation.

These estimations utilize the following dissociation reaction: thermal dissociation or photo dissociation:

FeB pair+heat or light→Fe_i (interstitial site)+B (boron)

The relationship between a diffusion length before dissociation Lbf and a diffusion length after the dissociation Laf is expressed as follows:

Diffusion length Lbf before dissociation ≧ diffusion length Laf after dissociation Although we leave more description in detail to the document [1], the principles will be described as follows: since carrier recombination ability of Fe_i, which does not pair with B and is present in a state of an interstitial site, is superior to that of the FeB pair (Fe present in a interstitial site pairing with the dopant element B) under light radiation intensities of about 1E12-1E14 photon/cm$^3$·sec in a common SPV device typically used for the linear SPV method, the diffusion length L decreases further in a forcibly, thermally dissociated or optically dissociated state, so that the concentration of the original FeB pair before dissociation can be estimated based on a variation of the diffusion length between before and after the dissociation.

If Fe present in an interstitial site is left at room temperature for a sufficient length of time, almost 100% thereof can be assumed to be present in a state where it pairs with B (FeB state). This is because B is included at a concentration of $1E16/cm^3$ or so in normal p-type crystalline silicon substrates for solar cells, which is sufficiently high with respect to Fe.

In addition, it is known that not only FeB pairs but also CrB pairs are dissociated by thermal dissociation. On the other hand, while FeB pairs are dissociated, CrB pairs are not dissociated by photo dissociation. Furthermore, it is known that while diffusion length decreases when FeB pairs are dissociated, diffusion length increases when CrB pairs are dissociated. Accordingly, photo dissociation is preferably used in cases where concentration of FeB pairs is desired to be determined with influence of increase in diffusion length due to dissociation of CrB pairs being previously eliminated. Therefore, hereinafter, the method for dissociating FeB pairs that is referred to in association with Fe concentration is assumed to be photo dissociation.

In normal multicrystalline silicon substrates fabricated by casting, concentrations of FeB pairs are about $1E11$-$1E12/cm^3$ in a state before they are processed into solar cells in central portions of the substrates excluding the bottom portion of the ingot and peripheral portions of substrates whose quality is degraded due to the "mixing source 2", although the values depend on the silicon starting material and the quality of casting components.

In order to reduce adverse effects of metal impurities, what is important first is to reduce contamination from the doping sources of metal impurities. However, it is not necessarily easy. This is because significant purification of the starting material and components leads to higher costs, it is not technically easy, and a certain degree of impurity mixing is inevitable in the process.

Therefore, supposing that a certain degree of impurity mixing is inevitable, reducing influence of mixed impurities as much as possible is important. Related to this, some techniques have been developed.

Gettering is widely known as a typical technique of that kind. Gettering is a technique for transferring impurity elements from a device region, which mainly represents a light active region in the case of a solar cell, to another region where they are secured. A well known, typical example thereof is gettering effect of metal elements by P (phosphorous) diffusion. This is referred to as "P gettering." In photovoltaic conversion devices according to the present invention, the P gettering effect is utilized when P is thermally diffused to form a pn junction for improvement of the properties.

The foregoing conventional P gettering effect that is additionally utilized for pn junction formation in photovoltaic conversion devices is not necessarily sufficient.

This is because the primary object of the P thermal diffusion process is to form a good pn junction, and such a condition for forming a good pn junction does not overlap a condition for maximizing the P gettering effect.

That is, a good condition for forming a good pn junction in normal photovoltaic conversion devices where the side of the pn junction is the light receiving surface requires not only achieving good diode characteristics, but also reducing light absorption loss caused by an n-layer that is highly concentrated as a result of P thermal diffusion as much as possible. Sufficient photovoltaic current for high efficiency solar cells cannot be obtained unless the thickness of the highly concentrated n-layer is made to be as small as 0.1-0.3 μm or less. In order to realize such a thin thermal diffusion region, for example, the peak temperature for thermal diffusion should be maintained in a range of about 800-850° C.,
and the time for the thermal diffusion should be about several minutes to 10 minutes.

However, this is not enough to extract a maximum P gettering effect.

To consider diffusion length of impurity elements that are the target of gettering as an index of gettering effect, it is about several tens to 200 μm for Fe and Cr under the foregoing P thermal diffusion conditions (thermal and temporal conditions). Since the thickness of a substrate is normally about 300 μm or so, from a view point of impurity diffusion length, gettering effect can be obtained advantageously to some extent.

However, in order to fully extract gettering effect, only considering the distance index is not sufficient.

While the concentration and thickness of the P thermal diffusion region are important indices that affect the gettering effect, it has been difficult to achieve sufficient values of them in conventional P thermal diffusion processes in which the peak temperature is restricted and the time for the thermal diffusion is short for forming a shallow pn junction.

In particular, because the P thermal diffusion process completes before gettering effect works sufficiently on substrates taken from a bottom region of the ingot where Fe concentration is high and peripheral regions of substrates originating from a side region of the ingot, despite a certain level of improvement in quality, the regions are still left as lower quality regions. As a result, sufficient improvement in properties cannot be achieved.

Here, the degree of insufficiency of P gettering can be estimated by comparing diffusion lengths Lafter returning the cell into the state of a substrate, that is, returning it into the state of a p-type silicon substrate by removing all of the electrodes, antireflection film, and junction layers, leaving only the bulk p-type region, which is a light active layer. In other words, if P gettering is sufficiently achieved in the entire substrate, diffusion length before light irradiation L≦diffusion length after light irradiation should be satisfied in the entire substrate. On the other hand, if it is insufficiently achieved, the ratios of the regions having the foregoing inequality relationship to the area of the substrate become smaller in parallel to the degree of insufficiency, by which estimation can be done.

For example, under the conventional P thermal diffusion conditions, since the foregoing sign of inequality relationship: diffusion length L before light irradiation≦diffusion length Lafter light irradiation is satisfied for the region of the substrate originating from the "mixing source 1", it is possible to verify that sufficient gettering effect is achieved. However, in the region of lower quality with serious metal contamination originating from the "mixing source 2", diffusion length L before light irradiation>diffusion length Lafter light irradiation is satisfied. That is, there are quite a few areas where FeB pairs are present at levels that are measurable by the SPV method. Therefore, this region with insufficiently improved quality is a great factor that restricts improvement of properties.

Meanwhile, improving the quality of substrates is relatively easy if the bottom portion of the ingot or side thereof that constitute the "mixing source 2" are removed. However, in this case, removal should be done referring to the above described thermal diffusion distance of about 10-20 mm. If this part is disposed of as waste, the part of silicon material that is disposed of leads to an increase of cost, which is problematic.

As discussed so far, it is obvious that if the region of the ingot with low quality originating from the "mixing origin 2" is sufficiently removed, improvement in properties can be achieved. Therefore, a method which allows the region of the ingot with low quality to be as free as possible from disposal as a result of trade-off between quality and cost has been anticipated.

A primary object of the present invention is to provide a photovoltaic conversion device using a crystalline silicon substrate with high electric properties in which influence of impurities such as Fe is reduced, and a process for manufacturing the device.

BRIEF SUMMARY OF THE INVENTION

A photovoltaic conversion device according to the present invention comprises: a p-type crystalline silicon substrate-doped with boron; the crystalline silicon substrate including a bulk substrate region comprising a light active region, a first region joining to a light receiving surface of the bulk surface region and a second region joining to a back surface of the bulk surface region.

With the first and second regions being removed, when a minority carrier diffusion length of the bulk substrate region is measured from the light receiving surface of the bulk surface region, the photovoltaic conversion device satisfies $$0.5 < (L1/Lpeak)$$

where $L1$ is a minority carrier diffusion length at an arbitrary measuring area of the light receiving surface of the bulk surface region, and Lpeak is a diffusion length corresponding to where a maximum peak on the side of higher diffusion length of a histogram, the histogram being formed from data obtained when the minority carrier diffusion length of the light receiving surface of the bulk surface region was measured at a plurality of measurement areas.

In other words, the condition described above is explained as follows: when a minority carrier diffusion length $L1$ on the light receiving surface of the bulk substrate region is measured at any position within the surface, the diffusion length $L1$ is greater than ½ of the value Lpeak of the maximum peak in the histogram. That is, there is no skirt area (where minority diffusion lengths are lower than ½ of Lpeak on the side of lower diffusion length of the histogram.

As described above, since the photovoltaic conversion device according to the present invention is arranged such that a minority carrier diffusion length in the bulk surface region comprising a light active region is a certain value (½ or more of Lpeak), it is possible to reduce adverse influence of impurities such as Fe contained in the bulk surface region on the photovoltaic conversion properties. In addition, it is possible to reduce adverse influence of Fe and the like on the photovoltaic conversion properties in a wide area of the substrate.

Meanwhile, "to remove the first and second regions" means to remove regions that are in direct or indirect contact with the bulk substrate region including a pn-junction region, a high-low junction region, an electrode region thereon and an antireflection film and the like from a photovoltaic conversion device such as a solar cell so as to return it to the state of a substrate.

In order to return a photovoltaic conversion device to the state of a substrate, mechanical grinding or chemical etching may be used.

If there are a plurality of peaks in the histogram, a maximum peak (maximum frequency) and the peak with next higher frequency are compared and the peak present on the side of higher diffusion length is determined as the peak on the side of higher diffusion length. In addition, if there is only a single peak is present, the peak is determined as the peak on the side of higher diffusion length.

A photovoltaic conversion device according to another aspect of the present invention is characterized in that when a minority carrier diffusion length Lbf of the bulk substrate region is measured from the light receiving surface of the bulk surface region before light irradiation, and a minority carrier diffusion length Laf of the bulk substrate region is measured from the light receiving surface of the bulk surface region after the light receiving surface of the bulk surface region is irradiated with light and photo-dissociated, a region where Lbf≦Laf is satisfied occupies 85% or more of the total area of the light receiving surface of the bulk surface region.

The photovoltaic conversion device with the aforementioned structure can exert the effect of reducing adverse influence of impurities such as Fe on the photovoltaic conversion properties in a wide area of the substrate.

When a multicrystalline silicon substrate is used as the crystalline silicon substrate, it is inexpensive compared to single crystal silicon substrates. When the structure of the present invention is applied to the multicrystalline silicon substrate whose properties are prone to degrade due to mixing of Fe and the like particularly in its manufacturing process, a multicrystalline silicon substrate with high properties can be obtained. In addition, a photovoltaic conversion device with high quality can be obtained at low cost.

The foregoing histogram can be formed by allocating diffusion lengths at intervals of 10 μm. In multicrystalline silicon substrates that are sliced out of a silicon ingot produced by casting, impurities such as Fe are prone to be diffused from a releasing agent and the like on the inner side surface of the mold into the side surface of the ingot in contact with the mold after the ingot is solidified and before it is cooled to room temperature. For this reason, concentration of impurities tends to be extremely high in peripheral regions of the multicrystalline silicon substrate. Therefore, when the structure of the present invention is applied to multicrystalline silicon substrates produced by casting with use of a mold, multicrystalline silicon substrates with high properties can be obtained, and at the same time, such peripheral regions can be saved instead of being disposed of as waste. Accordingly, utilization efficiency of silicon ingot can be enhanced, thereby realizing cost reduction of the photovoltaic conversion device.

The multicrystalline silicon substrate includes in a peripheral region of the surface a group of columnar crystal grains grown in one direction and/or a group of crystal grains greater in size than those in regions other than the peripheral region.

Surface regions of a multicrystalline silicon substrate corresponding to the side surface of the ingot in contact with the mold often take configurations including any of the following or a combination thereof:

(A) a group of narrow, elongated columnar grains grown in one direction in peripheral regions; and
(B) a group of crystal grains with sizes larger than crystal grains in the surface region other than the peripheral regions. Conventionally, in many cases, such peripheral regions are disposed of as waste because of their high inclusion of impurities. However, when the present invention is applied, multicrystalline silicon substrates with high properties can be obtained without disposing of such regions. As a result, the utilization efficiency of silicon ingot can be enhanced.

In addition, it is preferable to use the (SPV Surface Photovoltage) method for measuring minority carrier diffusion lengths in the present invention. Features of this method are recited as: it is a non-contact, non-destruction method; it allows measurements with high precision in a short time; it does not-require particular pretreatments of specimens; it is not easily influenced by the surface conditions; and the like.

A process of manufacturing a photovoltaic conversion device using a p-type crystalline silicon substrate comprising: a step A for forming a first n-type region on a light receiving surface of the p-type crystalline silicon substrate; a step B for forming a second n-type region on a surface of the p-type crystalline silicon substrate opposite to the light receiving surface; a step C for heat-treating the first n-type region; and a step D for heat-treating the second n-type region; wherein a thickness of the second n-type region is formed so as to be greater than that of the first n-type region.

In conventional photovoltaic conversion devices, gettering is effected only in the first n-type region that is provided for providing a pn-junction on the light-receiving surface of the p-type crystalline silicon substrate. However, because of the need of suppressing light absorption, such a n-type region is inevitably thin, leading to insufficient gettering.

On the other hand, according to the manufacturing process of the present invention, by forming a second n-type region on the opposite surface of the light-receiving surface and heat-treating it, gettering can be accomplished by the second n-type region. In addition, since light absorption loss does not need to be considered for the second n-type region, it can be formed to have a thickness greater than that of the first n-type region, so that strong gettering effect can be achieved. Accordingly, the photovoltaic conversion device manufactured by the manufacturing process of the present invention is free from influence of impurities such as Fe, and as a result, exhibits high photovoltaic conversion properties.

When the step B for forming the second n-type region and the step D of heat treatment thereof are carried out prior to the step B for forming the first n-type region and the step D of heat treatment thereof, gettering promotion effect can be more effectively accomplished in the second n-type region being separated from the first n-type region, and diffusion can be executed at a higher temperature, to a greater thickness and at a higher concentration.

Additionally, the steps of heat treatment of the first and second n-type regions may be carried out simultaneously. This allows the number of steps to be reduced.

DETAILED DESCRIPTION OF THE INVENTION

Hereinafter, some embodiments of photovoltaic conversion device according to the present invention will be described with reference to the drawings.

Figure 1A:
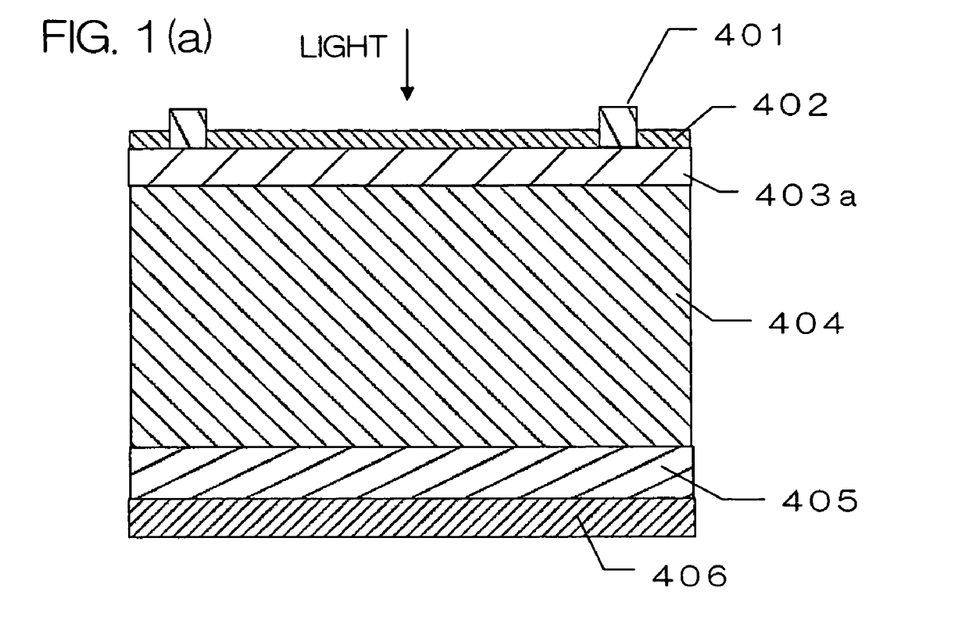
FIG. 1(a) is a cross-sectional view of a bulk solar cell representing one embodiment of photovoltaic conversion device according to the present invention.

FIG. 1(a) is a cross-sectional view showing a bulk solar cell constructed using a p-type multicrystalline silicon substrate doped with boron.

In the figure, a surface electrode is denoted by 401, an antireflection film is denoted by 402, a n-type silicon region is denoted by 403a, a p-type silicon light active region is denoted by 404, a p-type silicon BSF (back surface field) region is denoted by 405, and a back surface electrode is denoted by 406.

Among the foregoing elements, the n-type silicon region 403a, surface electrode 401, and the antireflection film 402 constitute a "first region", and the p-type silicon BSF region and back surface electrode 406 constitute a "second region".

Light is incident on the side of the antireflective film 402, and absorbed and converted into electric energy by the p-type silicon light active region 404, and thereby electron-hole pairs are created.

Figure 1B:
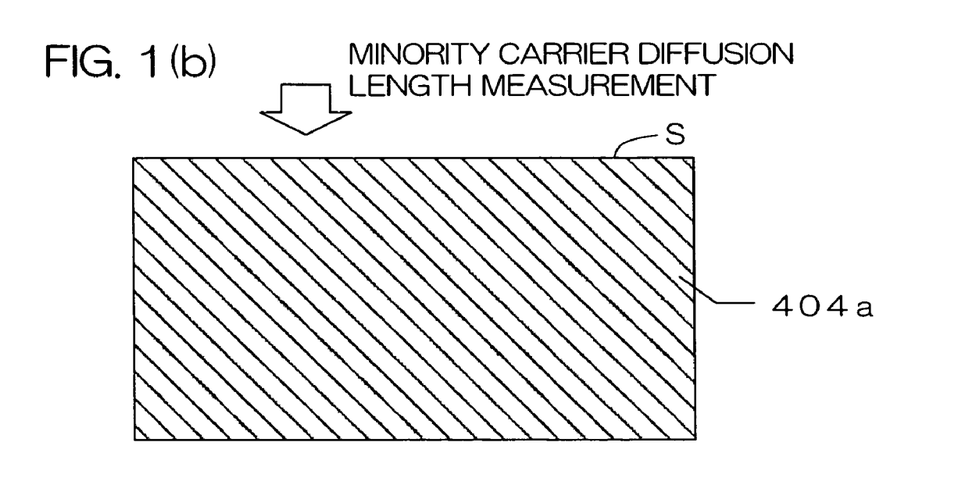
FIG. 1(b) is a cross-sectional view of a bulk substrate region of the bulk solar cell of FIG. 1(a).

FIG. 1(b) is a view of the p-type silicon light active region 404 that is independently taken from the bulk solar cell element in FIG. 1(a).

The p-type silicon light active region 404 taken from the solar cell is referred to as "bulk substrate region 404a".

In this bulk solar cell element, when a minority carrier diffusion length is measured from the light receiving surface side, the following condition is satisfied:

$$0.5 < (L1/Lpeak)$$

where L1 represents a minority carrier diffusion length at an arbitrary measurement point of the light receiving surface of the bulk substrate region 404a.

The term "Lpeak" is defined as follows:

Minority carrier diffusion lengths are measured from the light receiving side of the bulk surface region 404a and all over a light receiving surface S. The measured diffusion lengths are allocated at intervals of 10 μm, namely, 10 μm-20 μm, 20 μm-30 μm, 30 μm-40 μm, etc. The data of the diffusion lengths are represented as a histogram, in which the center value of the interval where a peak showing the greatest frequency in the histogram is present is defined as Lpeak.

For example, when the interval where the peak of the histogram is present is 160 μm-170 μm, Lpeak=165 μm is assumed.

However, this is not limited to the "center value" of an interval. The end values of the interval may be used as Lpeak. For example, when the interval is 160 μm-170 μm, it is possible to define as Lpeak=160 μm or Lpeak=170 μm.

Whether this photovoltaic conversion device satisfies the foregoing condition can be determined in the following manner:

First, in order to independently take the bulk substrate region 404a shown in FIG. 1(b) out of the photovoltaic conversion device shown in FIG. 1(a), the following treatment is carried out.

The surface electrode 401 and back surface electrode 406 are removed by dissolving with use of aqua regia: a mixture of hydrochloric acid and sulfuric acid, and the antireflection film comprising a $SiN_x$ film or the like is removed by etching with use of a HF solution, and the n-type silicon region 403a and p-type silicon BSF region 405 that constitute the pn junction region and the high-low junction region are removed by etching with use of a mixed acid ($HF:HNO_3$=1:3-1:4).

In the foregoing manner, the bulk substrate region 404a can be independently taken out of the photovoltaic conversion device. This bulk substrate region 404a is then subjected to measurements of minority carrier diffusion lengths by the SPV (Surface Photovoltage) method, which is carried out from the light receiving side throughout the light receiving surface S.

By the way, in order to carry out estimations using the SPV method with good reproducibility, the following conditions are required:

1) The wavelength of light for the measurements is sufficiently small compared to the thickness of the specimen, specifically, ¼ or less of the thickness of the specimen.
2) For the measurements, the surface is prepared to be a state of mirror to obtain a continuous surface, specifically, removal by etching with use of a mixed acid is carried out to obtain an etched surface in a state of mirror.
3) Measurements are carried out after leaving the specimen in the air at least for 1 week after the treated surface condition is stabilized.

The number of data used for forming a histogram may be ¼ or more of the number of a maximum measurement points that are determined based on the size of the bulk surface region 404a and the measurement size (for example, the spot size of light used in the SPV measurement).

For example, when a 150 square mm bulk surface region 404a is measured by the SPV method with a spot size of light of 6 mm, the maximum measurement points are (150/6)×(150/6)=25 points×25 points=625 points. Based on this, the number of data may be 625/4≈157 or more. For example, measurements of 13 points×13 points=169 points are carried out.

This allows a histogram to be formed with an adequate reliability, and the time required for the measurements to be shortened.

Figure 2A:
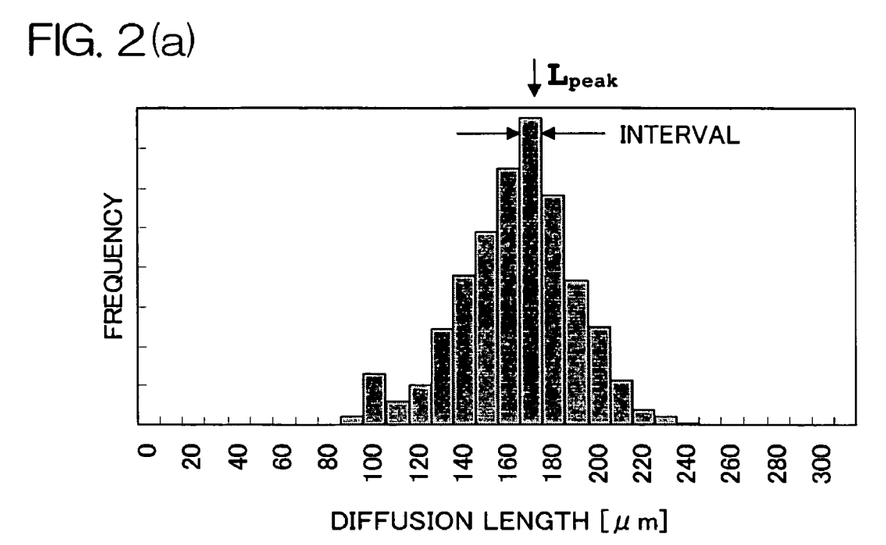
FIG. 2(a) is a histogram formed based on measurements of minority carrier diffusion length in the bulk substrate region of a photovoltaic conversion device according to the present invention.

FIG. 2(a) shows an example of a histogram with data allocated at intervals a width of which is 10 μm made after measurements of the aforesaid bulk surface region 404a, whose surface is measured all over by measuring minority carrier diffusion lengths by the SPV method.

Figure 2B:
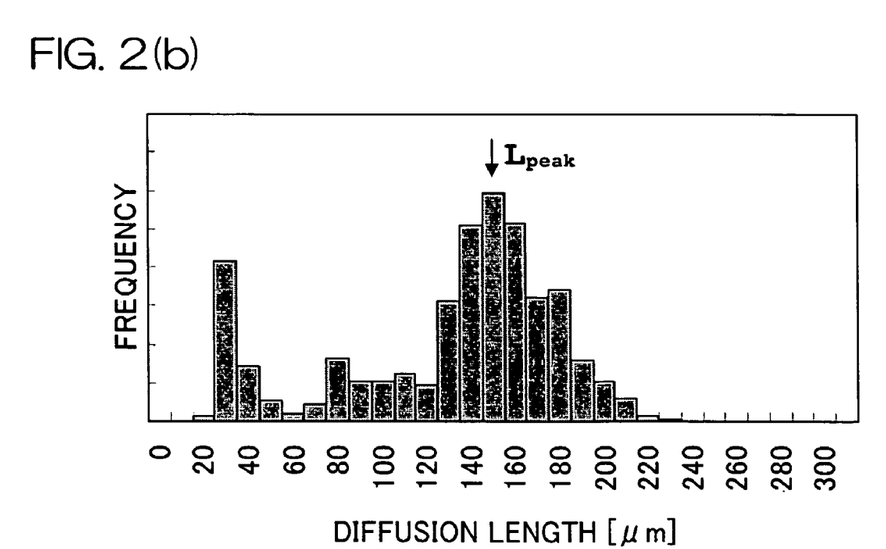
FIG. 2(b) is a histogram formed based on measurements of minority carrier diffusion length in the bulk substrate region of a conventional photovoltaic conversion device.

FIG. 2(b) shows an example of a histogram of a conventional photovoltaic conversion device which is formed in a similar way.

Broadly speaking, we find two distributions in the histogram of the conventional photovoltaic conversion device shown in FIG. 2(b): a distribution having a peak on the side of higher diffusion length (higher quality) and a distribution having a peak on the side of lower diffusion length (lower quality). What corresponds to the peak on the side of higher distribution length originates from the "mixing source 1", and what corresponds to the peak on the side of lower diffusion length originates from the "mixing source 2".

On the other hand, when we observe the histogram of the photovoltaic conversion device according to the present invention shown in FIG. 2(a), the distribution having a peak on the side of lower diffusion length disappears, and there is only a peak on the side of higher diffusion length.

Satisfying the foregoing condition of 0.5<(L1/Lpeak) means that when a minority carrier diffusion length L is measured at the light receiving surface of the bulk surface region 404a at any point, the minority carrier diffusion length L is larger than ½ of the maximum value Lpeak (170 μm in FIG. 2(a)), or larger than 85 μm.

That is, there is no skirt area (a region where minority carrier diffusion length is lower than 85 μm) on the left side of the histogram.

As described so far, the photovoltaic conversion device according to the present invention is arranged so that a minority carrier diffusion length L in the bulk surface region 404a, which is a light active region, is ½ or more of Lpeak at any point of measurement.

Accordingly, it is possible to suppress influence of impurities such as Fe included in the bulk surface region 404a and maintain the photovoltaic conversion efficiency to be high.

Meanwhile, in order to actually determine whether the foregoing condition 0.5<(L1/Lpeak) is satisfied, assume the minimum of all the minority carrier diffusion lengths measured for forming the histogram to be L1, and determine whether it satisfies the foregoing inequality with respect to the Lpeak that is found from the histogram.

Now, another embodiment of photovoltaic conversion device according to the present invention is described. Since the basic structure thereof is almost the same as that of the foregoing embodiment, only features that differ from it are described.

According to this measurement, the light receiving surface of the bulk surface region 404a shown in FIG. 1(b) is irradiated with light so that photo dissociation is caused.

Photo dissociation can be caused, for example, by irradiating the surface with white light with an irradiation intensity of 20 $W/cm^2$ for 10-15 seconds per point. In this way, the points irradiated with the light will be sufficiently photo-dissociated. Such white light can be generated by passing light of a halogen lamp through a UV filter and an IR filter so as to shield light in ultraviolet and infrared regions. Intensity of the halogen lamp may be adjusted so that it becomes the foregoing intensity after passing through these filters.

A minority carrier diffusion length Lbf before photo dissociation and a minority carrier diffusion length Laf after photo dissociation are measured to determine whether the region where Lbf≦Laf is satisfied occupies 85% or more of the entire area of the light receiving surface of the bulk substrate region 404a.

If it occupies 85% or more, that is determined to be a photovoltaic conversion device according to the present invention.

The photovoltaic conversion device with this structure can obtain in a wide region of the substrate the effect of reducing adverse influence of impurities such as Fe on photovoltaic conversion efficiency.

Now, a detailed description of the structure of the foregoing bulk solar cell element will be given.

In the foregoing bulk solar cell element, a multicrystalline silicon substrate is used as a p-type multicrystalline silicon substrate doped with boron.

While multicrystalline silicon substrates are inexpensive in comparison to single crystal silicon substrates, degradation of the properties tends to occur due to mixing of Fe particularly in the manufacturing process. However, by applying the foregoing structure of the present invention, high properties can be achieved.

From a cost reduction point of view, it is preferred that, among various multicrystalline silicon substrates, multicrystalline silicon substrates that are sliced out of a silicon ingot produced by casting using a mold be used.

In such ingots produced by casting, impurities such as Fe are thermally diffused, for example, from a releasing agent on the inner side surface of the mold after the ingot is solidified and before it is cooled to room temperature.

For this reason, concentration of impurities tends to be extremely high in peripheral regions of the multicrystalline silicon substrate corresponding to the side surface of the ingot that has been in contact with the mold, in particular, in regions that are 10-20 mm apart from the edges.

Surface regions of a multicrystalline silicon substrate corresponding to the side surface of the ingot that has been in contact with the mold often take configurations including any of the following or a combination thereof:

(A) a group of narrow, elongated columnar grains grown in one direction in peripheral regions; and
(B) a group of crystal grains with sizes larger than crystal grains in the surface region other than the peripheral regions.

Figure 3A:
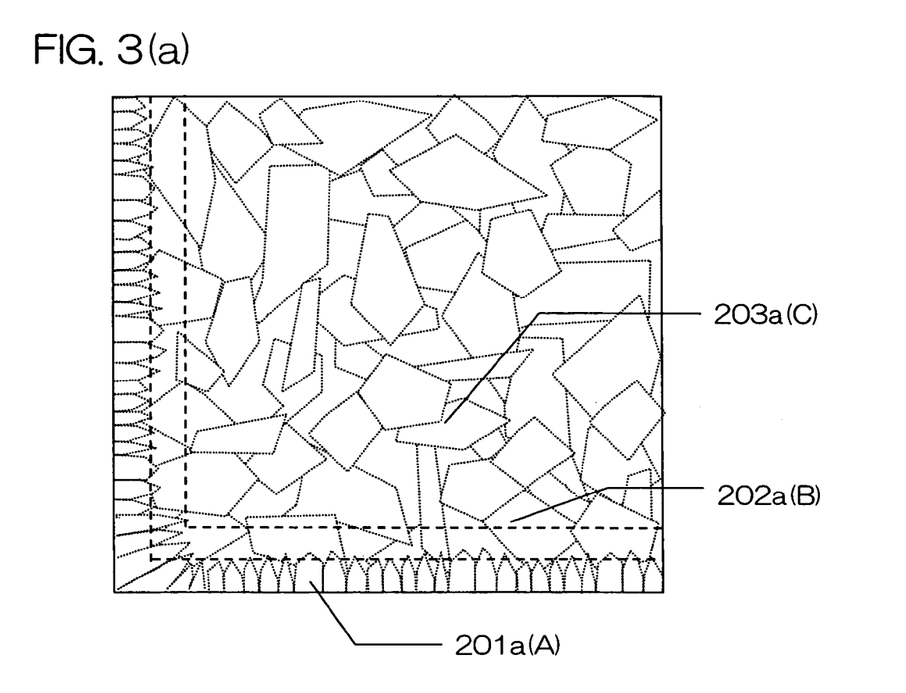
FIG. 3(a) schematically illustrates the configuration of crystal grains of a surface of a multicrystalline silicon substrate.
Figure 3B:
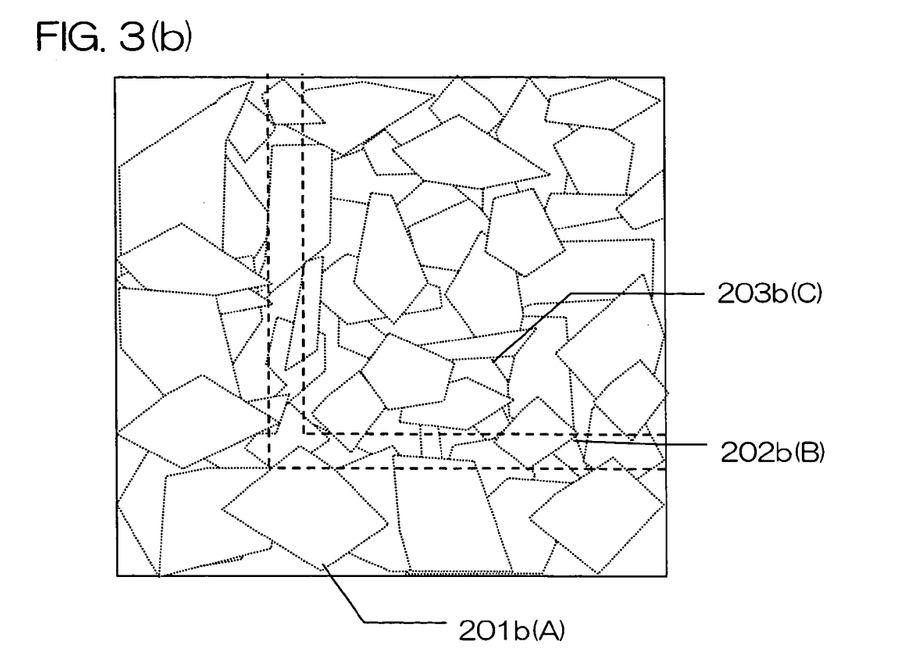
FIG. 3(b) schematically illustrates the configuration of crystal grains of a surface of a multicrystalline silicon substrate, where a difference from that of FIG. 3(a) is shown.
Figure 4A:
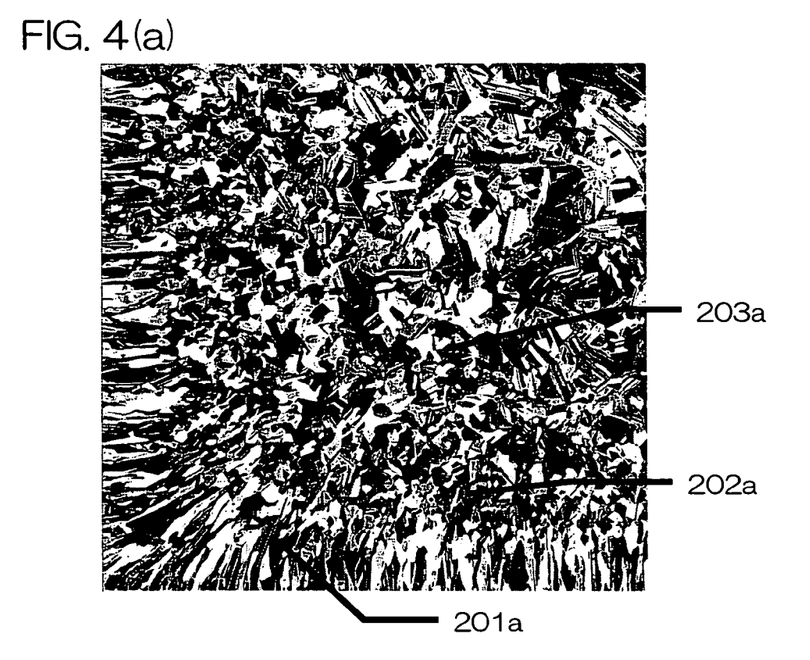
FIG. 4(a) is a photograph of a surface of a multicrystalline silicon substrate, which is represented by the drawing.
Figure 4B:
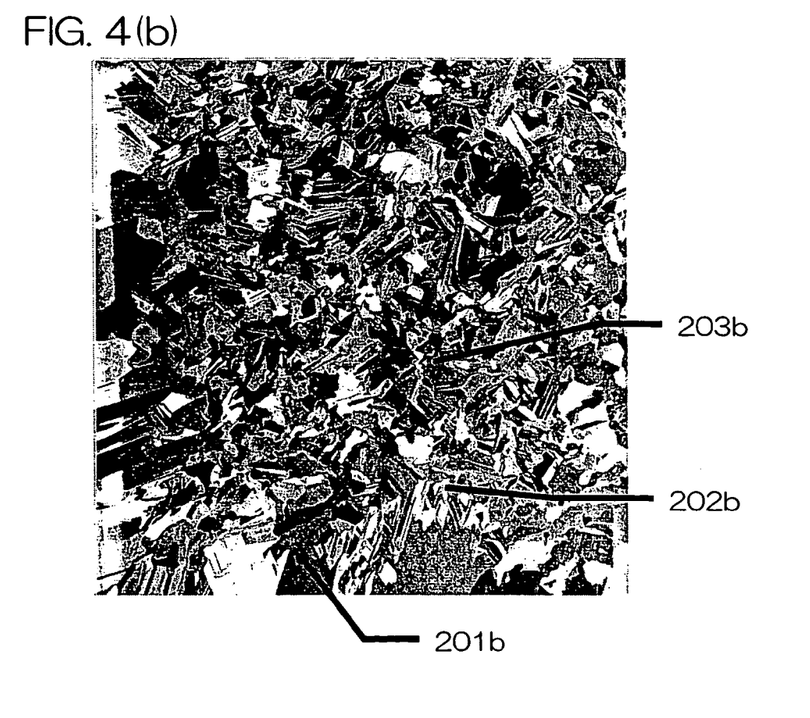
FIG. 4(b) is a photograph of a surface of a multicrystalline silicon substrate, which is represented by the drawing.

FIGS. 3 and 4 show examples of such multicrystalline silicon substrates having low quality substrate peripheral regions that correspond to the side surface of the ingot that has been in contact with the mold.

FIGS. 3(a) and 3(b) schematically illustrate configurations of crystal grains on the surface of multicrystalline silicon substrates. FIG. 3(a) corresponds to the case in (A) above, and FIG. 3(b) corresponds to the case in (B) above.

FIGS. 4(a) and 4(b) are photographs represented by drawings of surfaces of multicrystalline silicon substrates. FIG. 4(a) corresponds to the case in (A) above, and FIG. 4(b) corresponds to the case in (B) above.

In these drawings, region A denoted by 201 (201a, 201b) is the substrate peripheral regions with extremely low quality originating from the side region of the ingot ("mixing source 2"). Region C denoted by 203 (203a, 203b) is regions of the substrate with relatively high quality, which originates from the "mixing source 1".

Region B denoted by 202 (202a, 202b) are intermediate regions (in which influence of the "mixing source 2" is observed, while it is not as much as that in region A).

These drawing show that crystal grains in the substrate peripheral regions corresponding to the side region of the ingot have characteristic configurations as compared with those in central regions of the substrate apart from the edges.

FIGS. 3(a) and 4(a) includes elongated configurations that appear when the columnar crystal grains in the (A) above are cut at a plane including the axis of their growth direction. This is explained that while central regions of the ingot are easy to be solidified in one direction that is perpendicular to the ingot, in side regions of the ingot, crystal growth (columnar growth) occurs somehow obliquely to the perpendicular direction because it is impossible to bring heat emission toward the side surface to zero.

In addition, FIGS. 3(b) and 4(b) show that the substrate peripheral regions include a group of crystal grains with large sizes as shown in the above case (B).

Although the cause of the growth of such large crystal grains is not clear, it is speculated that such a group of crystal grains with great sizes are created when frequency of occurrences of nucleation growth is small in side regions of the ingot or when lateral growth occurs.

As discussed above, it is relatively easy to distinguish substrate peripheral regions corresponding to the side region of the ingot by the appearances of the substrates (distribution of crystal grains).

While conventionally, in many cases, substrate peripheral regions with such characteristic configurations tend to be disposed of as waste, they can be multicrystalline silicon substrates with high properties when the structure of the present invention is applied. Therefore, utilization efficiency of silicon ingot can be improved, which is economically favorable.

Hereinafter, a process of producing a bulk solar cell element according to the present invention will be described referring to FIGS. 5(a)-5(f).

FIGS. 5(a)-5(f) show cross sections of a photovoltaic conversion device according to the present invention, showing the manufacturing process step-by-step.

1. Preparation of Substrate (FIG. 5(a))

Figure 5A:
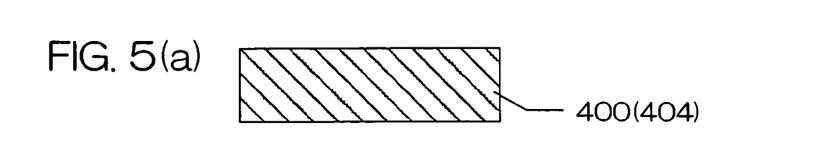
FIGS. 5(a)-(f) illustrate step-by-step a process of manufacturing a photovoltaic conversion device according to the present invention.

First, a p-type silicon substrate 400 doped with B is prepared. For the p-type silicon substrate 400, a multicrystalline silicon substrate sliced out of a multicrystalline silicon ingot produced by casting is used. The thickness of the substrate is preferably 500 μm or less, or more preferably, 350 μm or less.

A p-type silicon light active region included in the p-type silicon substrate 400 is denoted by 404 in FIG. 5.

The concentration of B, which is the dopant of the p-type silicon substrate, is preferably about 1E16-1E17/cm$^3$, where the specific resistivity of the substrate falls into a range of about 0.2-2Ω·cm. Regarding the doping, an appropriate amount of a single dopant element may be added during the production of the silicon ingot, or a mass of silicon whose dopant concentration is known may be mixed during the production of the silicon ingot.

2. Formation of Irregular Structure (FIG. 5(b))

Figure 5B:
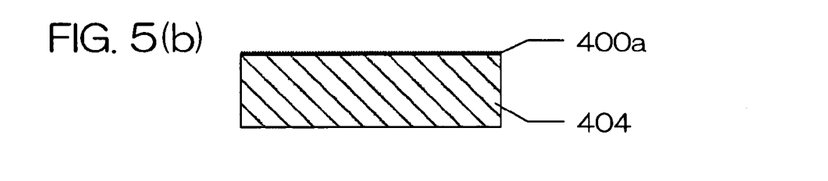

In the following step, an irregular structure 400a having the function of reducing light reflectance is formed on the side of the light receiving surface of the substrate.

In forming the irregular structure 400a, generally, an anisotropic wet etching method with use of an alkaline solution such as NaOH may be used. However, in cases where the substrate is a multicrystalline silicon substrate produced by casting, since plane orientations of crystal grains within the substrate differ randomly from grain to grain, it is difficult to uniformly form a good irregular structure 400a that can effectively reduce light reflectance throughout the substrate.

In this case, for example, gas etching such as the RIE (Reactive Ion Etching) method may be used, by which a good irregular structure 400a can be relatively easily formed all over the substrate.

Although formation of this irregular structure 400a is not always necessary, since this can contribute to reducing light reflectance and thereby improves conversion efficiency of the photovoltaic conversion device, this step is preferably included.

3. Formation of First n-type Region and Second n-type Region (FIG. 5(c))

Figure 5C:
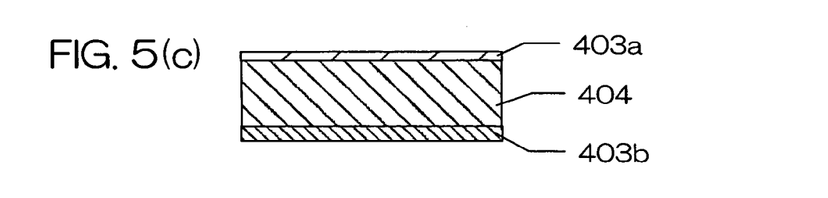

In the following step, an n-type silicon region 403a (which corresponds to first n-type region, hereinafter, "surface n-type region") for forming a pn junction on the light receiving surface, and an n-type silicon region 403b (which corresponds to the second n-type region, hereinafter, "back surface n-type region") for accomplishing the gettering promoting effect of the present invention are formed.

These n-type regions are preferably formed by thermal diffusion.

This is because the p-type silicon substrate 400 is also heated during the formation of n-type regions by thermal diffusion so that gettering of the p-type silicon substrate 400 is effected by the n-type regions (403a, 403b), which has the effect of reducing impurities inside the substrate.

Meanwhile, although these n-type regions (403a, 403b) may be provided by a thin film deposition method, in such a case, an additional step of heating the formed n-type region is necessary in order to promote gettering.

P is used for the n-type dopant element, and the concentration thereof is about $1E18-5E21/cm^3$ (i.e., $n^+$ type)

In addition, in the manufacturing method according to the present invention, it is necessary that the back surface n-type region 403b is always thicker than the surface n-type region 403a. This is because by forming the n-type diffusion region so that the back surface n-type region 403b is always thicker than the surface n-type region 403a, gettering of impurities from inside the substrate is further promoted.

Thicknesses of the both may be determined so that the back surface n-type region 403b is thicker than the surface n-type region 403a, namely, the surface n-type region 403a has a thickness of 0.1-0.3 μm and the back surface n-type region 403b has a thickness of 0.2-2 μm.

The thermal diffusion applied to the surface n-type region 403a may be a gas diffusion method with use of phosphorous silicate glass (PSG) that is formed from gas including P as the diffusion source. For the back surface n-type region 403b, a spin coat diffusion process with use of relatively thick PSG that is formed from a chemical solution including P as the diffusion source is preferably used.

Specifically, $POCl_3$ (phosphorus oxychloride) is used as the diffusion gas for the surface n-type region 403a, and thin PSG formed as a result of reaction between $POCl_3$ and the surface of the silicon substrate is used as the diffusion source, and P is thermally diffused at temperatures of 700-900° C., in which diffusion time is about 5 to 10 minutes for the peak temperature.

For the back surface n-type region 403b, a spin coat diffusion process with use of relatively thick PSG that is formed from a chemical solution including P as the diffusion source is used, and P is thermally diffused at temperatures of 700-1000° C., in which the diffusion time is about 5-20 minutes for the peak temperature.

The chemical solution containing P may be a solution containing $P_2O_5$ or $Ag_3PO_4$ or a phosphate compound such as ethyl phosphate that is liquid at an ordinary temperature (for example, diethyl phosphate, trimethyl phosphate, triethyl phosphate, tripropyl phosphate, triisopropyl phosphate, tributyl phosphate, etc.), or phosphite ester (for example, trimethyl phosphite, triethyl phosphite, tripropyl phosphite, triisopropyl phosphite, tributyl phosphite etc.), triethoxyphosphate or trimethoxyphosphate.

The concentration and thickness of the diffusion regions can be adjusted to be desired values by controlling diffusion temperature and diffusion time.

If the diffusion temperature and time are the same, the back surface n-type region 403b with thicker PSG layer results in having a thicker diffusion region than the surface n-type region 403a, where gettering is further promoted. However, preferably, in order to extract maximum gettering effect, the formation of the back surface n-type region 403b is carried out at higher temperatures and for longer time than formation of the surface n-type region 403a.

Meanwhile, the back surface n-type region 403b is preferably formed prior to the surface n-type region 403a. This is because the surface n-type region 403a has restriction that light absorption loss should be minimized at this region, and it is preferred that diffusion at the back surface n-type region 403b be carried out at higher temperatures, to be deeper, and at a higher concentration so as to more effectively obtaining gettering prompting effect.

It is of course possible to form the back surface n-type region 403b with gettering prompting effect in the same process as the surface n-type region 403a if the conditions for spin coat diffusion that is the diffusion method for the back surface n-type region 403b (P concentration and thickness of the coating material) are controlled for that purpose. What is important is to select appropriate conditions for balancing effects in properties with merits in cost.

It is preferable that PSG layers remaining on the surfaces of surface side and back side be removed by etching with a HF solution or the like. In particular, the PSG layer on the back side is removable by an inexpensive mechanical process such as sand blasting. Or, such particular removal is not necessary if the p-type silicon-BSF region 405 on the back side is formed by a print and bake process using paste composed mainly of Al as described later.

While a diffusion region is formed not only on the surface side of the substrate but also on the back side thereof when gas diffusion is employed (which is realized in the conventional process), gettering effect is not extracted maximally at present as described later. This is because the PSG layer formed on the back side by gas diffusion is too thin to be a diffusion region aimed at gettering, and the diffusion temperature and time are insufficient in terms of diffusion length of the impurities, the target of gettering.

Figure 5D:
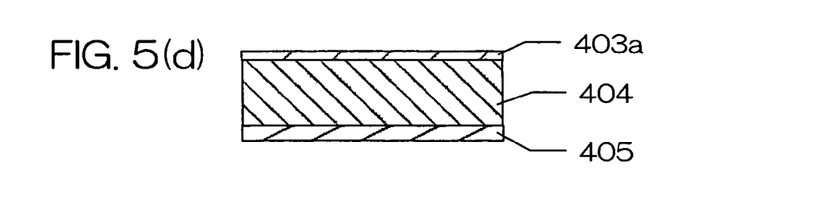

4. Formation of p-type Silicon-BSF Region (FIG. 5(*d*))

In the following step, the p-type silicon-BSF region 405 is formed. For the p-type dopant, Al or B may be used, and doping concentration is about $1E18-5\times1E21/cm^3$ (i.e., $p^+$ type).

This enables formation of a Low-High junction between the p-type silicon light active region 404 and p-type silicon-BSF region 405.

For the formation, print and bake process may be used, in which Al paste comprising Al powder, glass frit, organic solvent, a binder and the like is applied by printing, and then it is heat-treated (or baked) at a temperature of 700-850° C., thereby thermally diffusing Al, which is very advantageous in reducing the cost.

Employing the print and bake process enables not only the printed surface to be formed with the desired diffusion region, but also eliminates necessity for the removal of the back surface n-type silicon region 403b as already described.

Since the baked paste portion formed on the back side can be utilized as a back surface electrode, it does not need to be removed unless such need arises.

Incidentally, it is also possible to form the p-type silicon-BSF region 405 by heat treatment simultaneously with the formation of the surface electrode 401 by the print and bake process after forming the antireflection film 402 described later.

As described above, the back surface n-type region 403b maybe removed by etching after the diffusion process. However, when the back side BSF layer is formed using paste mainly composed of Al in this process, the back surface n-type region 403b is not required to be removed. This is because the p-type dopant Al can be diffused at a sufficient concentration and to a sufficient depth, and therefore influence of the back surface n-type region 403 that has been already diffused on the properties of n-type diffusion region can be ignored.

5. Formation of Antireflection Film (FIG. 5(e))

Figure 5E:
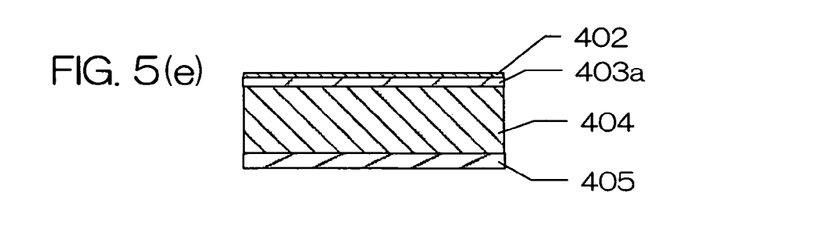

Now, the antireflection film 402 is formed.

The material for the antireflection film 402 may be $SiN_x$, $TiO_2$, $SiO_2$, MgO, ITO, $SnO_2$, ZnO or the like. The thickness thereof is determined properly according to the material for the purpose of no reflection against incident light, that is, $(\lambda/n)/4=d$ is the optimum thickness of an antireflection film, where n is the index of refraction of the material and $\lambda$ is the wavelength of the spectrum range for which no reflection is desired. For example, in the case of a generally used $SiN_x$ film (n=about 2), if the wavelength for no reflection is 600 nm, the film thickness may be about 75 nm or so.

The film is formed by the PECVD method, vapor deposition, sputtering or the like at temperatures of 400-500° C.

Although the antireflection film 402 can previously be formed into a predetermined pattern for the formation of surface electrode 401 later mentioned, it is not necessary when the surface electrode 401 is formed by the fire-through process described later.

If it is patterned, the process may be an etching process (wet or dry) using resist or the like for masking, or forming a mask previously to the formation of the antireflection film, which is removed after the formation of the antireflection film.

6. Formation of Electrodes (FIG. 5(f))

Figure 5F:
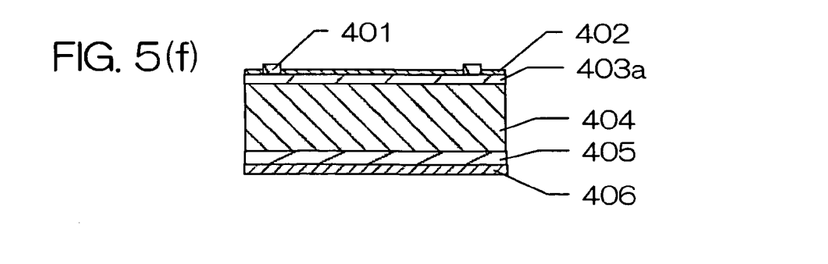

The surface electrode 401 is formed as follows:

The material for the surface electrode is preferably a low resistance metal comprising at least one element selected from among Ag, Cu, and Al. The formation process may be printing with use of paste including the recited metals, a print and bake process that includes baking process additionally to the aforementioned printing, or sputtering, or a vapor deposition technique such as thin film deposition.

In order to particularly improve adhesion strength between the surface electrode 401 and the silicon semiconductor, an oxide component such as $TiO_2$ is preferably included in a small amount in the paste in the printing process, and a metal layer mainly composed of Ti is interposed at an interface between the surface electrode 401 and the silicon semiconductor in a vapor deposition process.

In the print and bake process, properties such as wire resistance of the electrode, contact resistance against silicon, adhesion strength to silicon and the like can be controlled by the paste composition (composition of the metal powder, grain size thereof, shape thereof, composition of the glass component, mixing ratio thereof, etc.) and baking conditions (peak temperature: about 650-800° C., heat treatment time at the peak temperature: about several seconds to 1 minute). However, in particular, when the paste composition is controlled, electric contact with the silicon can be made by a component of the paste breaking the antireflection layer (fire-through technique) without resorting to patterning of the previously formed antireflection film for making electric contact between the silicon of the electrode and the antireflection film. For instance, when a $SiN_x$ film is used for the antireflection film, an appropriate amount of zinc oxide (ZnO) is included in the composition, by which fire-through can be accomplished.

Processes for forming the back surface electrode 406 are described below. The material for the back surface electrode is preferably a metal material composed mainly of Ag that has high reflectance to silicon. However, a metal material composed mainly of Al whose reflectance to silicon is somewhat inferior to Ag may be effectively used unless particularly high efficiency is desired.

The process used may be a printing technique with use of paste containing these metals, a print and bake process that includes a baking process additionally to the printing, sputtering, or a vapor deposition technique such as thin film deposition.

In order to particularly improve adhesion strength between the back surface electrode 406 and the base material, an oxide component such as $TiO_2$ is preferably included in a small amount in the paste in a printing process, and a metal layer mainly composed of Ti is preferably interposed at an interface between the back surface electrode 406 and the base material in a vapor deposition process.

In the latter case, the thickness of the metal layer mainly composed of Ti is preferably 5 nm or less so that lowering of the reflectance caused by the insertion of a metal layer can be suppressed.

In order to enhance the reflectance of light with a long wavelength that has reached the back surface, the back surface electrode 406 is preferably formed over the entire back surface of the substrate. However, when a baked paste component formed upon formation of the p-type silicon-BSF region 405 is utilized as the back surface electrode, this is not the case.

Lastly, solder layers (not diagramed) may be each formed on the surface electrode 401 and back surface electrode 406 by solder dipping.

Through the steps described above, a bulk solar cell element as an embodiment of the present invention is realized.

In cases where a multicrystalline silicon substrate that is sliced out of a silicon ingot produced by casting is used, generally, concentration of impurities tends to be extremely high in peripheral regions of the multicrystalline silicon substrate corresponding to the side surface of the ingot that has been in contact with the mold, in particular, in regions that are 10-20 mm apart from the edges, which results in great variations in the photovoltaic conversion efficiency inside the substrate. However, by applying the process of manufacturing a photovoltaic conversion device according to the present invention, photovoltaic conversion devices with high properties can be obtained even when such a substrate is employed.

While conventionally, in many cases, peripheral regions of multicrystalline silicon substrates with high impurity concentration tend to be disposed of as waste, these regions can be effectively utilized by the present invention, which is advantageous in terms of cost.

Meanwhile, it is needless to say that embodiments of the present invention are not limited to the foregoing embodiments, and various other modifications may be made without departing from the scope of the present invention.

For example, while the above description has been given taking a multicrystalline silicon substrate obtained by casting as an example, the process is not limited to the casting, and the present invention is also applicable to multicrystalline silicon substrates produced by other-methods.

The substrate is not limited to multicrystalline silicon substrates, and the present invention is applicable also to single crystal substrates represented by solar cell-grade single crystal substrates.

In addition, although minority carrier diffusion length is used as a physical quantity representing the quality of the substrate in the description above, a similar description can be given by using minority carrier lifetime that is relevant to the minority carrier diffusion length. The relationship between lifetime $\tau$ and diffusion length L is expressed as $L=\sqrt{(D\ \tau)}$. Here, D is a diffusion constant(: about 30-32 cm$^2$/s). Measurement of minority carrier lifetime can be effected, for example, by the μPCD (microwave photoconductive decay) method.

Furthermore, while a bulk solar cell element is taken as an example in the above description, the present invention is not limited to this kind, but may be embodied in any form so long as it does not depart from the advantage of the present invention. In other words, the present invention is also applicable to photovoltaic conversion devices other than solar cells including optical sensors, photo diodes and the like.

EXAMPLE

An advantageous effect of the present invention will be described referring to a bulk multicrystalline silicon solar cell element fabricated according to the embodiment above.

The substrate was-selected among multicrystalline silicon substrates produced by casting to be substrates shown in FIGS. 3 and 4 that have the low quality substrate peripheral regions originating from a side portion of the ingot with characteristic crystal grain configurations, which were used as the boron-doped p-type multicrystalline silicon substrate.

The dimensions of the substrate were 15 cm square and thickness thereof was 300 μm.

1) Minority carrier diffusion length of the substrate before processing for a solar cell element (before application of the present invention).

First, measurements of minority carrier diffusion lengths of these multicrystalline silicon substrates (before processing) were carried out. The measurement apparatus used was a SPV apparatus (Cat. No. FAaST210E-SPV) produced by SDI Semiconductor Instruments Srl, Italy.

The size of the measurement spot region was about 6 mm φ, and measurement points were set as 169 points (a grid pattern of 13×13). Meanwhile, the relationship between the measurement points and the region A (201a, 201b), region B (202a, 202b) and region C is: region A corresponds to one row of measurement points at the peripheral region corresponding to the substrate peripheral region originating from a side region of the ingot; region B corresponds to one row of measurement points that is immediately interior to region A; and region C corresponds to 11×11 measuring points other than these.

The multicrystalline silicon substrates were each etched with a mixed acid to about 20 μm from its surface so as to remove the damaged region during the slicing out of the substrate, and at the same time, finished so as to be a mirror surface. Then, they were surface treated with a diluted HF solution and cleaned with pure water. Thereafter, it was left in the air for more than one week or so until the treated surface was stabilized. Then, the measurements of diffusion lengths were carried out. A histogram of distribution of minority carrier diffusion lengths of one of the measured multicrystalline silicon substrates before processing is shown in FIG. 2(b).

As is apparent from this histogram, the diffusion lengths are particularly small at region A belonging to the low quality substrate peripheral region, and region B indicates the next lowest values, which is the region corresponding to the side region in the state of an ingot, where influence of contamination by impurity diffusion from the contact surface with the mold can be observed.

2) Minority carrier diffusion lengths and Fe concentration of substrate before processing for solar cell element (before application of the present invention) before and after light irradiation.

Subsequently, measurements of diffusion lengths were carried out before and after light irradiation.

The intensity of light for photo dissociation was 20 W/cm$^2$ (light source: halogen lump), and irradiation time was 15 seconds per point. Incidentally, since the boron-doping concentration in the substrate was on the order of 1E16/cm$^3$ or more, and the time constant at re-pairing reaction between the photo-dissociated F and B could be on the order of several ten minutes or less, the measurements had to be completed within several minutes after the light irradiation. For this reason, the measurement points were lessened to nine points (3×3 pattern).

The average values of five measurement points are shown for region B, the average values of four measurement points are shown for region C (since region A could not be included in the 9 point measurement, only the value of Lbf at the 169 point measurement is shown in parentheses.

Table 1 shows average values [μm] of the diffusion length Lbf before light irradiation, and average values [μm] of the diffusion length Laf after light irradiation at the respective regions A, B and C measured on multicrystalline silicon substrates in the state of after casting and before processing for solar cell element.

In addition, FeB pair concentrations [/cm$^3$] predicted based on the variations of diffusion lengths between before and after light irradiation are also shown in Table 1.

TABLE 1

Minority carrier diffusion length and FeB concentration before and after photo dissociation of substrate before processing for solar cell element (before application of the present invention)

| | REGION A | REGION B | REGION C |
|---|---|---|---|
| BEFORE DISSOCIATION Lbf[μm] | (25) | 83 | 154 |
| After DISSOCIATION Laf[μm] | — | 45 | 110 |
| FeB[/cm$^3$] | — | 3.5E12 | 4E11 |

Table 2 shows Fe concentrations at regions A, B and C measured by atomic absorption spectrometry.

TABLE 2

Fe concentration before processing for solar cell element (before application of the present invention)

| | REGION A | REGION B | REGION C |
|---|---|---|---|
| Fe[/cm$^3$] | 1.7E14 | 5.8E12 | BELOW MEASURABLE LIMIT |

From Table 1, it is apparent that the FeB-pair concentration at region B that is closer to the low-quality substrate peripheral region is 3.5E12, which is higher than 4E11 of region C, and the degree of Fe diffusion from the contact surface with the mold can be observed.

In addition, from Table 2, it is apparent that the Fe concentration varies according to the relationship of: Fe concentration at region A>Fe concentration at region B>Fe concentration at region C, and the degree of Fe diffusion from the contact surface with the mold into the substrate peripheral region can be observed. Incidentally, the Fe concentration at region C was below the measurable limit (4E12/cm$^3$).

3) Electric properties and fabrication conditions of solar cell element according to the present invention.

Using the multicrystalline silicon substrate (300 μm thick) mentioned above, a bulk solar cell element according to the present invention (in which P gettering effect at the back surface of the substrate was promoted) was fabricated by the process shown in FIG. 5. At the same time, using the same multicrystalline silicon substrate, a bulk solar cell element (in which P gettering effect at the back surface of the substrate was not promoted) was fabricated by a conventional technique.

Table 3 shows properties of the solar cell elements fabricated by the conventional technique and by the technique of the present invention.

TABLE 3

Photoelectric conversion efficiency of solar cell element according to the present invention and conventional solar cell element

| SURFACE ELECTRODE | Isc[A] | Voc[mV] | FF | EFFICIENCY (%) |
|---|---|---|---|---|
| CONVENTIONAL DEVICE | 7.542 | 603.4 | 0.745 | 15.07 |
| DEVICE OF THE PRESENT INVENTION 1 | 7.628 | 613.2 | 0.752 | 15.59 |
| DEVICE OF THE PRESENT INVENTION 2 | 7.654 | 616.1 | 0.752 | 15.76 |

Table 4 shows the respective P diffusion conditions of the solar cell elements.

TABLE 4

P diffusion region forming conditions for element substrate according to the present invention and conventional element substrate.

| | SURFACE SIDE DIFFUSION METHOD × TIME | BACK SURFACE DIFFUSION METHOD × TIME | ORDER OF DIFFUSION |
|---|---|---|---|
| CONVENTIONAL ELEMENT | THERMAL GAS DIFFUSION 805° C. × 15 MIN | THERMAL GAS DIFFUSION 805° C. × 15 MIN | SURFACE/BACK SURFACE SIMULTANEOUS |
| ELEMENT OF THE PRESENT INVENTION 1 | THERMAL GAS DIFFUSION 805° C. × 15 MIN | THERMAL COAT DIFFUSION 900° C. × 10 MIN | DIFFUSION OF BACK SURFACE FOLLOWED BY |
| ELEMENT OF THE PRESENT INVENTION 2 | THERMAL GAS DIFFUSION 805° C. × 15 MIN | THERMAL COAT DIFFUSION 900° C. × 20 MIN | DIFFUSION OF BACK SURFACE FOLLOWED BY |

As is apparent from Table 3, the solar cell elements according to the present invention have properties higher than those of the solar cell elements fabricated by the conventional technique.

4) The above described conventional solar cell element and that according to the present to invention were returned to their substrate state, and measurements of diffusion lengths were carried out from the light receiving surface at 169 points all over the substrate so as to investigate distribution of the diffusion lengths.

In order to measure the diffusion lengths after fabrication of solar cell elements, they needed to be returned to the state of substrate.

The surface electrode and back surface electrode of each of the solar cell elements were removed by dissolving with use of aqua regia, and then the antireflection film comprising a $SiN_x$ film or the like was removed by etching with use of an HF solution, and lastly, diffusion regions including the junction region on the surface side and BSF layer on the back surface side were removed by etching, thereby returning the elements to the state of substrate (when, at the same time, the substrates were brought into mirror state).

Thereafter, they were surface treated with a diluted HF solution and cleaned with pure water, left in the air for about 1 week or more until the heat-treated surface condition was stabilized, and then measurements of diffusion lengths were carried out.

Meanwhile, hereinafter, substrate returned from the conventional element and that returned from the element according to the present invention are referred to as "conventional element substrate" and "element substrate of the present invention", respectively.

FIG. 2(a) is a histogram of distribution of minority carrier diffusion lengths of the element substrate of the present invention. As is apparent from the histogram, there is no distribution on the side of lower diffusion length (lower quality), and a peak is present on the side of higher diffusion length (higher quality).

Region A comprising peripheral regions of the element substrate of the present invention includes characteristic configurations of crystal grains originating from a side region of the ingot. FIG. 2(a) show that even though a substrate including substrate peripheral regions close to the interface between the ingot and mold with extremely low quality is used, there is no distribution having a peak on the side of lower diffusion length (lower quality), and high element properties can be achieved.

Table 5 shows that diffusion length Lpeak at a maximum peak position that appears on the side of higher diffusion length originating from region C is 175 μm in the element substrate of the present invention. Similarly, the value at the maximum peak position Lpeak was 165 μm in the conventional element substrate.

Moreover, Table 5 shows "L1/LPeak" values calculated based on the minimum values L1 of the minority carrier diffusion lengths of the respective specimens. The values are 0.42 for the conventional element substrates and 0.69 and 0.82 for the element substrate of the present invention.

Meanwhile, the values shown in Table 5 are based on a histogram created on specimens other than those used for creating the histogram in FIG. 2, and therefore slightly different from them.

TABLE 5

Results of calculations based on histogram for element substrates of the present invention and conventional element substrate

| | DIFFUSION LENTH OF MAXIMUM PEAK[μm] | L1/LPEAK MINIMUM VALUE |
|---|---|---|
| CONVENTIONAL ELEMENT SUBSTRATE | 165 | 0.42 |
| ELEMENT SUBSTRATE OF THE INVENTION 1 | 175 | 0.69 |
| ELEMENT SUBSTRATE OF THE INVENTION 2 | 175 | 0.82 |

It is apparent as shown in Table 5 that the minimum value of L1/Lpeak of the conventional element substrate is 0.42, which is smaller than 0.5, while the minimum values of L1/Lpeak are each greater than 0.5 in the element substrates of the present invention.

Table 6 shows results on diffusion lengths of conventional element substrate and element substrates of the present invention, showing values before light irradiation Lbf and those after light irradiation Laf.

The values Lbf and Laf are the averages of values at respective regions by the same 9×9 point measurements as mentioned above. However, since simultaneous measurements were impossible about region A, only values of Lbf at 169 point measurements are shown in parentheses.

TABLE 6

Minority carrier diffusion length for each region of element substrate of the present invention and conventional element substrate.

| | | REGION A | REGION B | REGION C |
|---|---|---|---|---|
| CONVENTIONAL ELEMENT SUBSTRATE | Lbf[μm] | (72) | 161 | 168 |
| | Laf[μm] | — | 143 | 167 |
| | FeB[/cm³] | — | 1E11 | — |
| ELEMENT SUBSTRATE OF THE INVENTION 1 | Lbf[μm] | (144) | 169 | 175 |
| | Laf[μm] | — | 171 | 176 |
| | FeB[/cm³] | — | — | — |
| ELEMENT SUBSTRATE OF THE INVENTION 2 | Lbf[μm] | (167) | 172 | 179 |
| | Laf[μm] | — | 173 | 182 |
| | FeB[/cm³] | — | — | — |

As is apparent from Table 6, the diffusion lengths are improved in all the regions in the element substrates of the present invention compared to those of the conventional element substrate, and in particular, the degree of improvement is great for regions A and B corresponding to low quality substrate peripheral regions.

To take the values of Lbf as an example, Lbf(region A)/Lbf(region C)=about 43% in the conventional element substrate, and Lbf(region A)/Lbf(region C)=about 71% in the element substrate 1 of the present invention, and Lbf (region A)/Lbf(region C)=about 82% in the element substrate 2 of the present invention. These results clearly show an advantageous effect of the present invention.

In addition, when comparison is made on the relationship in magnitude between Lbf and Laf, while it is apparent that gettering effect has worked because Lbf≦Laf is satisfied at region C in the conventional element substrate, the relationship is maintained as Lbf>Laf at region B, which indicates that Fe remains at a detectable level by the SVV method.

Meanwhile, to explain why Lbf≦Laf at region C, an idea would be a reaction system in which, contrary to FeB, carrier recombination energy weakens after photo dissociation. However, it is not known at present. A thermal dissociation phenomenon of CrB and the like associated with temperature elevation at the substrate is considered as one possible cause.

When the conventional element substrate is observed, the ratio of region C to the area of the substrate is about 75%, by which the ratio at regions of the conventional element substrates where Lbf≦Laf is satisfied to the substrate area can be estimated to be about 75% at the maximum.

On the other hand, according to the present invention, the relationship of Lbf≦Laf at regions at least at regions excluding region A and the area ratio thereof can be estimated as about 85% at the minimum.

Here, what is noteworthy is that, according to the present invention, even with substrates including peripheral regions having characteristic configurations of crystal grains originating from a side region of the ingot, it is possible to achieve the area ratio of regions where Lbf≦Laf is satisfied as high as about 85% or more, so that high element conversion efficiency can be achieved.

As described so far, in the present invention, by effectively promoting gettering effect, the quality of substrates can be improved even with multicrystalline silicon substrates having substrate peripheral regions with low quality. As a result, it is verified that properties of solar cells can be effectively improved by the present invention.

The disclosure of Japanese patent application Serial No. 2003-431594, filed on Dec. 25, 2003, is incorporated herein by reference.

What is claimed is:

1. A photovoltaic conversion device comprising:
   a bulk substrate region doped with boron;
   wherein a peripheral region of a surface of the bulk substrate region includes a group of columnar crystal grains grown in one direction in an elongated manner or a group of crystal grains greater in size than crystal grains in a surface region other than the peripheral region, and the bulk substrate region satisfies the following condition:

$0.5 < (L1/L\text{peak})$, where L1 is a minority carrier diffusion length at an arbitrary measuring area of the light receiving surface of the bulk surface region, and Lpeak is a minority carrier diffusion length corresponding to a maximum peak on the side of higher diffusion length of a histogram, the histogram being presented from data obtained when the minority carrier diffusion lengths of the light receiving surface of the bulk surface region are measured at a plurality of measurement areas.

2. A photovoltaic conversion device comprising:
   a bulk substrate region doped with boron;
   wherein a peripheral region of a surface of the bulk substrate region includes a group of columnar crystal grains growth in one direction in an elongated manner or a group of crystal grains greater in side than crystal grains in a surface region other than the peripheral region, and a region where Lbf<Laf is satisfied occupies 85% or more of the total area of the light receiving surface of the bulk surface region, where Lbf is a minority carrier diffusion Length of the bulk substrate region measured from the light receiving surface of the bulk surface region before light irradiation, and Laf is a minority carrier diffusion length of the bulk substrate region measured from the light receiving surface of the bulk surface region after the light receiving surface of the bulk surface region is irradiated with light and FeB pairs are photo-dissociated.

* * * * *